(12) United States Patent
MacFarlane et al.

(10) Patent No.: US 7,911,207 B2
(45) Date of Patent: Mar. 22, 2011

(54) METHOD FOR DETERMINING LOCATION AND MOVEMENT OF A MOVING OBJECT

(75) Inventors: Duncan L. MacFarlane, Dallas, TX (US); Richard Briggs, Dallas, TX (US); Andrei A. Zaremba, Richardson, TX (US); Keith D. White, Gainesville, FL (US)

(73) Assignee: Board of Regents, The University of Texas System, Austin, TX (US)

( * ) Notice: Subject to any disclaimer, the term of this patent is extended or adjusted under 35 U.S.C. 154(b) by 197 days.

(21) Appl. No.: 12/152,917

(22) Filed: May 19, 2008

(65) Prior Publication Data
US 2009/0039235 A1   Feb. 12, 2009

Related U.S. Application Data

(63) Continuation-in-part of application No. 11/282,046, filed on Nov. 16, 2005, now Pat. No. 7,498,811.

(51) Int. Cl.
*G01V 3/00* (2006.01)
(52) U.S. Cl. ........................... 324/307; 324/309
(58) Field of Classification Search .......... 324/300–322; 600/407–445
See application file for complete search history.

(56) References Cited

U.S. PATENT DOCUMENTS

| | | | |
|---|---|---|---|
| 5,365,927 A | 11/1994 | Roemer et al. | |
| 5,408,409 A | 4/1995 | Glassman et al. | |
| 5,617,857 A | 4/1997 | Chader et al. | |
| 5,810,728 A | 9/1998 | Kuhn | |
| 6,187,018 B1 * | 2/2001 | Sanjay-Gopal et al. | 606/130 |
| 6,282,437 B1 * | 8/2001 | Franck et al. | 600/429 |
| 6,490,473 B1 | 12/2002 | Katznelson et al. | |
| 6,584,339 B2 | 6/2003 | Galloway, Jr. et al. | |
| 6,597,935 B2 | 7/2003 | Prince et al. | |
| 6,879,160 B2 | 4/2005 | Jakab | |
| 6,892,089 B1 | 5/2005 | Prince et al. | |
| 7,231,243 B2 * | 6/2007 | Tearney et al. | 600/407 |
| 7,240,839 B2 * | 7/2007 | Jung et al. | 235/454 |
| 7,474,407 B2 * | 1/2009 | Gutin | 356/479 |
| 7,613,501 B2 * | 11/2009 | Scherch | 600/427 |
| 7,676,062 B2 * | 3/2010 | Breed et al. | 382/100 |
| 7,831,358 B2 * | 11/2010 | Breed et al. | 701/45 |
| 2002/0087101 A1 | 7/2002 | Barrick et al. | |
| 2004/0267111 A1 | 12/2004 | Feinberg | |
| 2005/0054910 A1 | 3/2005 | Tremblay et al. | |
| 2005/0177054 A1 | 8/2005 | Yi et al. | |
| 2005/0182319 A1 | 8/2005 | Glossop | |
| 2008/0036580 A1* | 2/2008 | Breed | 340/438 |

* cited by examiner

*Primary Examiner* — Brij B Shrivastav
(74) *Attorney, Agent, or Firm* — Schultz & Associates, P.C.

(57) ABSTRACT

The present invention discloses a method for determining location and movement of a moving object. One embodiment of the method tracks the movement of a target during medical imaging scanning and transmits the position shift to the medical imaging scanning device in real time. The method includes the steps of projecting structured light on the target, receiving the reflection of structured light, converting the received structured light into spatial positions, and transmitting the positional shift to the medical imaging scanning device. The method further includes the step of adjusting the medical imaging scanning device in response to the positional change to increase accuracy.

19 Claims, 10 Drawing Sheets

FIG. 1

```
%CALCULATIONS OF THE FIRST MATRIX
A=0; B=0; C=0; D=0;
c=sum(t);          %sum of the columns
r=sum(t');         %sum of the rows
For j=l:40,
A=A+c(j)*j;        %calculating the weighed average for the columns
end
for i=l:40,
B=B+r(i)*i;        %calculating the weighed average for the rows
end
for j=l:40,
C=C+c(j);          %calculating the sum of the vector c(columns);
end
for i=l:40,
D=D+r(i);          %calculating the sum of the vector r(rows);
end
A=A/C;             %A=center of mass of rows of the matrix
B=B/D;             %B=center of mass of the columns on the matrix %CALCULATIONS FOR THE SECOND MATRIX
Q=0; W=0; E=0; R=0;
c1=sum(y);         %sum of the columns
r1=sum(y');        %sum of the rows
for jj=l:40,
Q=Q+c1(j)*jj;      %calculating the weighted average for the columns
end
for jj=l:40,
E=E+c1(jj);        %calculating the sum of the vector c1 (columns);
end
for ii=l:40,
R=R+r1(ii);        %calculating the sum of the vector r1 (rows);
end
Q=Q/E; %Q=center of mass of rows of the matrix
W=W/R;             %W=center of mass of the columns on the matirx
%Calculation of the distance between the two
%Our variables are A->Q;B->W;
columns=abs(A-Q);
rows=abs(B-W);
distance=(rowsA2+columnsA2)A(.5);
angle=atan(columns/rows);
```

```
x=imread('zero.jpg');

y=imread('Image_0140.jpg');

c=normxcorr2(x(:,:,1), y(:,:,1));

[max_c, imax]=max(abs(c(:)));

[ypeak, xpeak]=ind2sub(size(c), imax(1));

XY_offset=[(xpeak-size(y,2))
           (ypeak-size(y,1))];
```

```
in1=imread('rect1.jpg'); %input1=abs(fft2(in1)); input1=imread('rect1.jpg');
%input 1=double(input 1(:,:,1));
oRows=size(input1, 1);
 oCols=size(input1,2);
dTheta=2*pi/ oCols;              % the step size for theta
b=10 A (log1 0(oRows)/ oRows);   % base for the log-polar conversion
for i=1:oRows      % rows
     for j=l:oCols      % columns
           r=b^i-1;    % the log-polar
           theta=j*dTheta;
           x=round(r*cos(theta)+size(input1,2)/2);
           y=round(r*sin(theta)+size(input1,1)/2);
           if (x>0) & (y>0) & (x<size(input1,2)) & (y<size(input1,1))
                   output1(I,j)=input1 (y,x);
                   end
      end
end
in2=imread('rect2.jpg'); input2=in2; %input2=double(input2(:,:,1));
%input2=abs(fft2(in2rotated));
oRows=size(input2,1); oCols=size(input2,2);
dTheta=2*pi/ oCols;    % the step size for theta
b=10 A (log10(oRows)/ oRows);     % base for the log-polar conversion
for i=1:oRows     % rows
     for j=1:oCols  % columns
           r=b^i-1;    % the log-polar
           theta=j*dTheta;
           x=round(r*cos(theta)+size(input2,2)12);
           y=round(r*sin(theta)+size(input2,1)/2);
           if (x>0) & (y>0) & (x<size(input2,2)) & (y<size(input2,1))
                   output2(i,j)=input2 (y,x);
                   end
      end
end;
x=output1; y=output2; fx=(fft2(output1)); fy=(fft2(output2));
 %fx=fftshift(fx); %fy=fftshift(fy); %polar(fx); %figure,polar(fy);
c=normxcorr2(fx(:,:,1),fy(:,:,1));
[max_c, imax]=max(abs(c(:)));
[ypeak, xpeak]=ind2sub(size(c),imax(1));
XY_offset=[(xpeak-size(y,2)) (ypeak-size(y,1))]; %imagesc(output1), colormap('gray'),
figure, imagesc(output2), colormap('gray');
```

*FIG. 4*

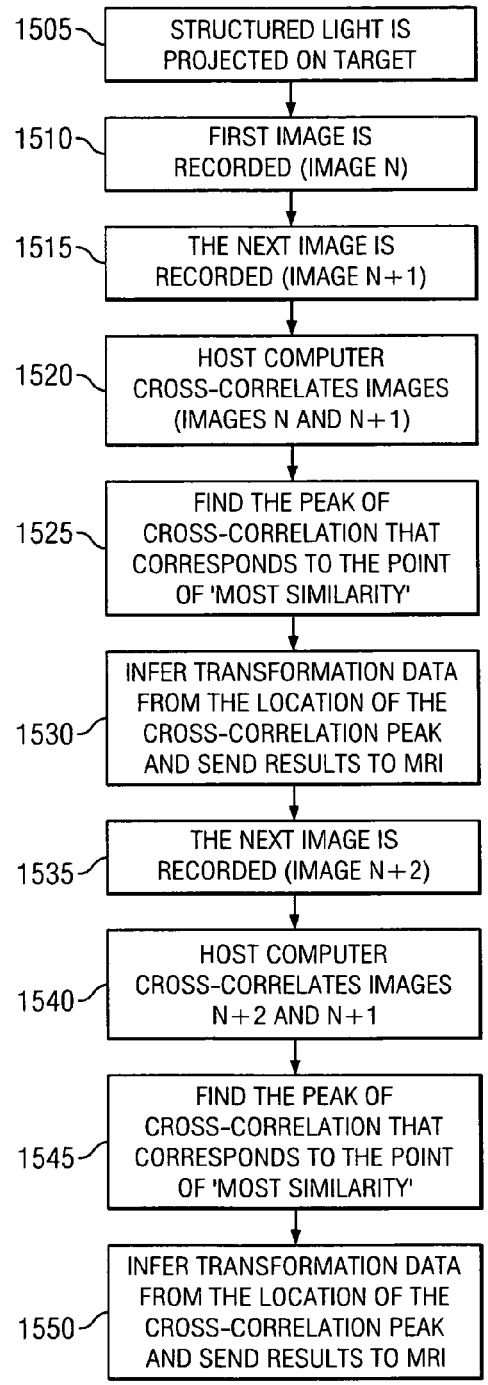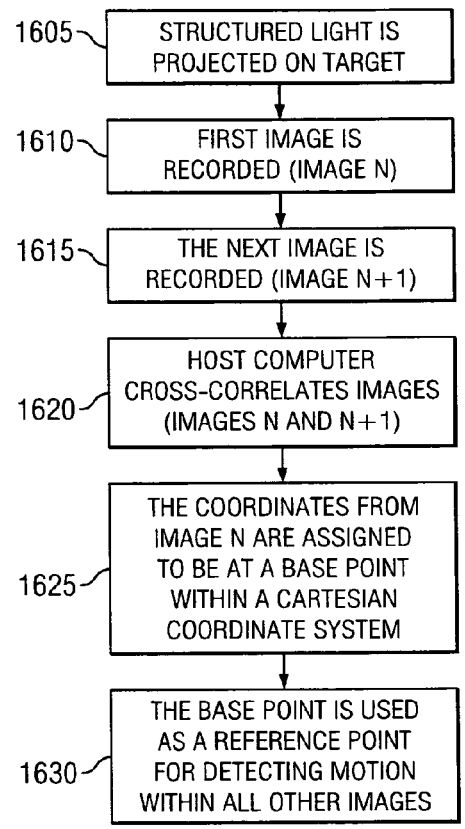
FIG. 15
FIG. 16

METHOD FOR DETERMINING LOCATION AND MOVEMENT OF A MOVING OBJECT

CROSS REFERENCE TO RELATED APPLICATIONS

This application is a Continuation-In-Part claiming priority benefit from U.S. patent application Ser. No. 11/282,046 which was filed on Nov. 16, 2005 now U.S. Pat. No. 7,498,811.

TECHNICAL FIELD OF THE INVENTION

The present invention relates, in general, to the field of motion tracking, and in particular to head tracking in a magnetic resonance imaging application. In particular the invention teaches an apparatus and method to track the movement of a target in three-dimensional space during medical imaging scanning using optical technology. The invention further comprises an apparatus and method to use the head tracking data to control the magnetic field gradients and/or radio frequency fields of the magnetic resonance imaging instrument thereby maintaining active image registration during the scans.

BACKGROUND OF THE INVENTION

Computerized tomography (CT), magnetic resonance imaging (MRI), and positron emission tomography (PET), coupled with developments in computer-based image processing and modeling capabilities have led to significant improvements in the ability to visualize anatomical structures in human patients. This information has become invaluable in the diagnosis, treatment, and tracking of patients. The technology has been recently been expanded to be used in conjunction with real-time interventional procedures.

MRI is the method of creating images (referred to as MR images) of the internal organs in living organisms. The primary purpose is demonstrating pathological or other physiological alterations of living tissues. MRI has also found many niche applications outside of the medical and biological fields such as rock permeability to hydrocarbons and certain non-destructive testing methods such as produce and timber quality characterization. Superb image contrast for soft tissues and millimeter scale spatial resolution has established MRI as a core imaging technology in most medical centers. MRI is unique among imaging modalities in that any one of a multitude of tissue properties can be extracted and highlighted.

The MRI process requires a highly accurate and stable target which to image. This is a consequence of the process by which medical MRI functions. Medical MRI most frequently relies on the relaxation properties of excited hydrogen nuclei in water. When the object to be imaged is placed in a powerful, uniform magnetic field, the spins of the atomic nuclei with non-zero spin numbers within the tissue all align in one of two opposite directions: parallel to the magnetic field or antiparallel.

The difference in the number of parallel and antiparallel nuclei is only about one in a million. However, due to the vast quantity of nuclei in a small volume, the nuclei sum to produce a detectable change in field strength. The magnetic dipole moment of the nuclei then moves in a gyrating fashion around the axial field. While the proportion is nearly equal, slightly more nuclei are oriented at the low energy angle. The frequency with which the dipole moments process is called the Larmor frequency. The tissue is then briefly exposed to pulses of electromagnetic energy (RF pulse) in a plane perpendicular to the magnetic field, causing some of the magnetically aligned hydrogen nuclei to assume a temporary non-aligned high-energy state.

In order to selectively image the different voxels (3-D pixels) of the material in question, three orthogonal magnetic gradients are applied. The first is the slice selection, which is applied during the RF pulse. Next comes the phase encoding gradient, and finally the frequency encoding gradient, during which the tissue is imaged. Most of the time, the three gradients are applied in the X, Y, and Z directions of the machine. As a consequence of this methodology, any small shift in the position of the patient with respect to these fixed gradient axes will alter the orientations and positions of the selected slices.

In order to create an MR image, spatial information must be recorded along with the received tissue relaxation information. For this reason, magnetic fields with an intensity gradient are applied in addition to the strong alignment field to allow encoding of the position of the nuclei. A field with the gradient increasing in each of the three dimensional planes is applied in sequence. This information is then subsequently subjected to a Fourier transformation by a computer that transforms the data into the desired image and yields detailed anatomical information results.

With conventional anatomic MR imaging, the presence of moving biological tissue is problematic. The tissue produces image artifacts, degrades the quality of the images, and complicates the interpretation of MR images. The typical appearance of such image artifacts takes the form of "blurring," or a characteristic "motion ghost" in the phase encoding direction associated with incorrectly encoding the spatial frequencies of a moving object that is assumed to be static.

The typical medical resolution is about 1 mm, while research models can exceed 0.1 mm. Through the process of MRI, anatomy can be defined in great detail, and several other biophysical and metabolic properties of tissue, including blood flow, blood volume, elasticity, oxygenation, permeability, molecular self-diffusion, anisotropy, and water exchange through cell membranes, can also be represented. Conventional anatomical MR imaging uses this spin-echo, gradient-echo, and inversion recovery sequencing. There are other methods of MR that are currently being used, including magnetic resonance spectroscopy (MRS), apparent diffusion coefficient (ADC) mapping, diffusion-weighted imaging (DWI) and its derivatives of diffusion tensor imaging and tractography, perfusion imaging, permeability imaging, MR angiography (MRA), and functional MRI (fMRI). As the techniques of MR become more precise, there is corresponding need for increased accuracy and the tracking of the patient during the MR procedure. See E. Fukushima and S. B. W. Roeder, *Experimental Pulse NMR* Addison-Wesley, Reading, MA 1981; T. C. Farrar, *An Introduction To Pulse NMR Spectroscopy* Farragut Press, Chicago, 1987; R. C. Jennison, *Fourier Transforms and Convolutions* Pergamon Press, NY 1961; E. O. Brigham, *The Fast Fourier Transform* Prentice-Hall, Englewood Cliffs, N.J. 1974; and A. Carrington A. D. McLachlan, *Introduction To Magnetic Resonance* Chapman and Hall, London 1967 which are each hereby incorporated by reference.

Functional MRI (fMRI) measures signal changes in the brain that are due to changing neural activity. This scan is completed at a low resolution but at a very rapid rate (typically once every 1-3 seconds). Increases in neural activity cause changes in the MR signal via a mechanism called the BOLD (blood oxygen level-dependent) effect. Increased neural activity causes a corresponding increased demand for oxygen, which is responded to by the vascular system, which increases the amount of oxygenated relative to deoxygenated hemoglobin. Because deoxygenated hemoglobin attenuates the MR signal, the vascular response leads to a signal increase that is related to the neural activity. The use of MRI to measure physiologic and metabolic properties of tissue non-invasively requires dynamic imaging to obtain time-series data.

One example of the use of fMRI is to measure brain activity. This use relies on a well-established neurovascular coupling phenomenon that results in transient increases in blood flow, oxygenation, and volume in the vicinity of neurons that are functionally activated above their baseline level. Signal changes due to the blood oxygenation-level-dependent (BOLD) effect are intrinsically weak (only several percent signal change from baseline at 4.0 T or less). In addition, as BOLD imaging is typically coupled with a repetitive behavioral task (e.g., passive sensory, cognitive, or sensorimotor task) to localize BOLD signals in the vicinity of neurons of interest, there is significant potential for fMRI to be confounded by the presence of small head motions. Specifically, such motion can introduce a signal intensity fluctuation in time due to intra-voxel movement of an interface between two different tissues with different MR signal intensities, or an interface between tissue and air. Random head motion decreases the statistical power with which brain activity can be inferred, whereas task-correlated motion cannot be easily separated from the fMRI signal due to neuronal activity, resulting in spurious and inaccurate images of brain activation. In addition, head motion can cause mis-registration between neuroanatomical MR and fMR images that are acquired in the same examination session. This latter point is important because the neuroanatomical MRI data serve as an underlay for fMRI color maps, and mis-registration results in mis-location of brain activity. An analogous problem exists for aligning anatomical and functional MR images performed on different days.

Lack of motion in current MRI examinations anatomic motion is not merely preferred, but is instead absolutely essential. Most aspects of human motor system performance require the patient to execute a movement as part of the behavioral task that is imaged to visualize brain activity. Movements can be very simple (e.g., self-paced finger tapping) or more complex (e.g., visually-guided reaching). Such examinations require both that the desired movement is performed in a well-controlled or well-quantified fashion, and also that the movement does not induce task-correlated head motion that confounds the ability to observe brain activity using fMRI. Perhaps the most complicated scenario involves combining use of virtual reality (VR) technology with fMRI, to determine brain activity associated with VR tasks for assessment and rehabilitation of impaired brain function. Such applications are important from the standpoint of "ecological validity" as they provide the opportunity to visualize brain activity associated with tasks that generalize well to everyday behavior in the real 3D-world. For example, position tracking would be required to provide realistic visual representation of a virtual hand operated by a data glove in a virtual environment.

The problem of motion tracking within an fMRI environment has been well documented in published medical literature describing various aspects of motion detection and quantitation. See Seto et al., NeuroImage 2001, 14:284-297; Hajnal et al., Magn Res Med 1994, 31: 283-291; Friston et al., Magn Res Med 1996, 35:346-355; Bullmore et al., Human Brain Mapping 1999, 7: 38-48; Bandettini et al., Magn Res Med 1993, 30:161-173; Cox. Comp Med Res 1996, 29:162-173; Cox et al., Magn Res Med 1999, 42:1014-1018; Grootoonk et al., NeuroImage 2000, 11:49-57; Freire et al., IEEE Trans Med Im 2002, 21(5):470-484; Babak et al., Magn Res Im 2001, 19:959-963; Voklye et al. 1999, Magn Res Med 41:964-972, which are each incorporated by reference.

As the clinical applications of MRI expand, there is a concurrent requirement for improved technology to visualize and determine the position and orientation of moving objects in the imaging field. Improvements in position tracking technology are required to advance the resolution and quality of the MRI, including the ability to image the anatomy of a patent, the imaging of tissue functions, the use of MRI data for other imaging modalities, and interventional applications.

For anatomical and functional MRI applications, as well as interventional MRI, there is the additional need to register data from other imaging modalities to provide comprehensive and complementary anatomical and functional information about the tissue of interest. The registration is performed either to enable different images to be overlaid, or to ensure that images acquired in different spatial formats (e.g., MRI, conventional x-ray imaging, ultrasonic imaging) can be used to visualize anatomy or pathology in precisely the same spatial location. While some algorithms exist for performing such registrations, computational cost would be significantly reduced by developing technology that enables data from multiple different imaging modalities to be inherently registered by measuring the patient's orientation in each image with respect to a common coordinate system.

By detecting, tracking, and correcting for changes in movement, data acquisition can be synchronized to a specific target. As a consequence, MR data acquisition is gated to a specific position of the target, and by implication, to a specific position of a specific target region.

U.S. Pat. No. 6,067,465 to Foo, et al. discloses a method for detecting and tracking the position of a reference structure in the body using a linear phase shift to minimize motion artifacts in magnetic resonance imaging. In one application, the system and method are used to determine the relative position of the diaphragm in the body in order to synchronize data acquisition to the same relative position with respect to the abdominal and thoracic organs to minimize respiratory motion artifacts. The time domain linear phase shift of the reference structure data is used to determine its spatial positional displacement as a function of the respiratory cycle. The signal from a two-dimensional rectangular or cylindrical column is first Fourier-transformed to the image domain, apodized or bandwidth-limited, converted to real, positive values by taking the magnitude of the profile, and then transformed back to the image domain. The relative displacement of a target edge in the image domain is determined from an auto-correlation of the resulting time domain information.

There is often a need in neuroimaging to look for changes in brain images over long periods of time, such as the waxing and waning of MS lesions, progressive atrophy in a patient with Alzheimer's disease, or the growth or remission of a brain tumor. In these cases, the ability to determine the position of anatomy as a function of time is extremely important to detect and quantify subtle changes. High-spatial resolution is a basic requirement of 3D brain imaging data for patients with neurological disease, and motion artifacts a consequence of movement during scanning pose a significant problem. If a patient does not stay completely still during MR neuroimaging the quality of the MR scan will be compromised.

Many of the advantages of MRI that make it a powerful clinical imaging tool are also valuable during interventional procedures. The lack of ionizing radiation and the oblique and multi-planar imaging capabilities are particularly useful during invasive procedures. The absence of beam-hardening artifacts from bone allows complex approaches to anatomic regions that may be difficult or impossible with other imaging techniques such as conventional CT. Perhaps the greatest advantage of MRI is the superior soft-tissue signal contrast available, which allows early and sensitive detection of tissue changes during interventional procedures.

MR is used for procedures such as "interventional radiology", where images produced by an MRI scanner guide surgeons in a minimally invasive procedure. However, the non-magnetic environment required by the scanner, and the strong magnetic radiofrequency and quasi-static fields generated by the scanner hardware require the use of specialized instruments. Exemplary of such endoscopic treatment devices are devices for endoscopic surgery, such as for laser surgery disclosed in U.S. Pat. No. 5,496,305 to Kittrell et al, and biopsy devices and drug delivery systems, such as disclosed in U.S. Pat. No. 4,900,303 and U.S. Pat. No. 4,578,061 to Lemelson.

Prior art attempts at tracking motion using cross-correlation and other simple distance measurement techniques have not been highly effective where signal intensities vary either within images, between images, or both. U.S. Pat. No. 6,292,683 to Gupta et al. discloses a method and apparatus to track motion of anatomy or medical instruments between MR images. The invention includes acquiring a time series of MR images of a region of interest, where the region of interest contains the anatomy or structure that is prone to movement, and the MR images contain signal intensity variations. The invention includes identifying a local reference region in the region of interest of a reference image and acquired from the time series. The local reference region of the reference image is compared to that of the other MR images and a translational displacement is determined between the local reference region of the reference image and of another MR image. The translational displacement has signal intensity invariance and can accurately track anatomy motion or the movement of a medical instrument during an invasive procedure. The translational displacement can be used to align the images for automatic registration, such as in myocardial perfusion imaging, MRA, fMRI, or in any other procedure in which motion tracking is advantageous. One of the problems with this invention, is that the application and implementation of this methodology has proven difficult.

Two implementations of this correction scheme have been disclosed. The first is where a correlation coefficient is calculated and used to determine the translational displacement, and one in which the images are converted to a binary image by thresholding (using signal intensity thresholds) and after computation of a filtered cross-correlation, a signal peak is located and plotted as the translational displacement. Examples of techniques using this approach are shown in U.S. Pat. No. 5,947,900 (Derbyshire) and U.S. Pat. No. 6,559,641 (Thesen)

U.S. Pat. No. 6,516,213 to Nevo discloses a method and apparatus to determine the location and orientation of an object, while the body is being scanned by magnetic resonance imaging (MRI). Nevo estimates the location and orientation of various devices (e.g., catheters, surgery instruments, biopsy needles) by measuring voltages induced by time-variable magnetic fields in a set of miniature coils, said time-variable magnetic fields being generated by the gradient coils of an MRI scanner during its normal imaging operation. However, unlike the present invention, the system disclosed by Nevo is not capable of position tracking when imaging gradients are inactive, nor is it capable of measurements outside the sensitive volume of the imaging gradients.

A subset of all of the above correction schemes is currently conventionally employed in fMRI. As in anatomical MRI, these schemes remain an incomplete solution to the problem and the search for improved motion suppression continues. Typically, fast imaging is employed to "freeze" motion within the fMRI acquisition time frame, in combination with use of head restraints to limit motion. It is still possible to achieve poor activation image quality if patients exhibit task-correlated motion on the order of 1 millimeter. This problem is particularly manifest in specific patient populations (e.g. dementia, immediate post-acute phase of stroke). Furthermore, image-based coregistration algorithms suffer from methodological limitations. Consequently, the resulting co-registered images still can suffer from residual motion contamination that impairs the ability to interpret brain activity.

Another method of tracking the position of a patient in an MRI is disclosed in US Application 2005/0054910, published Mar. 10, 2005. In this approach, a reference tool is fixed to a stationary target as close as possible to the centre of the sensitive measuring volume of an MRI-compatible camera system. There are several drawbacks of this approach, including the requirement of a second "tracking" component that must be calibrated with a dummy object, the position ambiguity due to the configuration of this approach, and the inherent limitation of the resolution provided by this approach.

U.S. Pat. No. 6,879,160 to Jakab describes a system for combining electromagnetic position and orientation tracking with magnetic resonance scanner imaging. Jakab discloses a system where the location of a magnetic field sensor relative to a reference coordinate system of the magnetic resonance scanner is determined by a tracking device using a line segment model of a magnetic field source and the signal from a magnetic field sensor. However, resolutions provided by the Jakab invention are not as precise as is possible.

There is consequently a need for improved patient movement tracking techniques in medical imaging. There is a need for improved patient movement tracking that can function in adverse environments including high strength magnetic and/or radio frequency fields without the tracking mechanism exerting it's own RF pulse or magnetic field. There is a need for improved patient movement tracking techniques that can be performed in real time. In particular, but without limitation, there is a need for real time tracking of a patient's head position in a high field strength fMRI without disrupting the scanning by the fMRI.

SUMMARY OF THE INVENTION

The present invention includes improvements to the field of tracking patient movement in an MRI application. An apparatus and method are taught to track the movement of a patient's head during medical imaging scanning using optical technology. Feedback control of the gradient and/or radiofrequency magnetic fields can provide real time correction of imaging data.

The following terms should be given the following meanings:

"Cross-correlation"—Cross-correlation is meant to include the process used to calculate the geometric translation differences between two separate and independent images. This process also compares two sequences of images on element-by-element bases and can provide the point of peak of most similarity.

"Structured light"—Structured light is meant to include patterns of light that are suitable for cross-correlation. Generally speaking this may include a bundle of light rays that may be patterned or structured in order to enhance the performance of an optical measurement. Typically, the encoding of structured light is predetermined, so that the record of optical data can be optimally processed for spatial measurements. Examples of structured light may include, but are not limited to, amplitude encoding, phase encoding, or a chromatic (or color) encoding.

"Phase correlation"—Phase correlation is meant to include the method of taking the Fourier Transform of two or more images and correlating the relative phases to find rotation or scale between them.

"Laser"—The term laser includes illumination sources of sufficient intensity to drive detector optics to get a result. The illumination sources can include broadband sources such as incandescent lamps and flashbulbs. Narrowband sources are also included such as gas discharge lasers or solid-state compound ataxia lasers. Illumination sources can also include LEDs and/or arrays of LEDs. Illumination sources can further include sources of selected wavelength ranges or groups of ranges.

One embodiment of the instant invention is a system that is taught used in conjunction within an MRI machine that uses a predetermined pattern placed or projected onto a patient's head to track movement of a patient during an MRI scan. Optical systems incorporating structured light and a processor record the position and movement of the pattern and are able to perform mathematical analysis of the pattern to determine the positional shift of the patient. Weighted averages, Fourier transforms, Hadamard matrices and cross-correlation of data related to X-Y translation, rotation and scaling of the image of the pattern are used to analyze movement of the patient's head. Feedback related to the movement is provided to the MRI machine that allows for adjustments in focusing coils for real time tracking of the patient's movements during the MRI procedure. As a result, the MRI procedure becomes more accurate as it is adjusted for the patient's movements.

BRIEF DESCRIPTION OF THE DRAWINGS

For a more complete understanding of the features and advantages of the present invention, reference is now made to the detailed description of the invention along with the accompanying figures in which corresponding numerals in the different figures refer to corresponding parts and in which:

FIG. 1 is example of pseudo Matlab code that can be used in the weighted average approach of comparing two images.

FIG. 4 is example of pseudo Matlab code that can be used in the Fourier-Mellin approach of comparing two images.

FIG. 15 is a flow chart illustrating a translation detection algorithm.

FIG. 16 is a flow chart illustrating a calibration algorithm.

DETAILED DESCRIPTION OF THE INVENTION

Figures 2, 3:
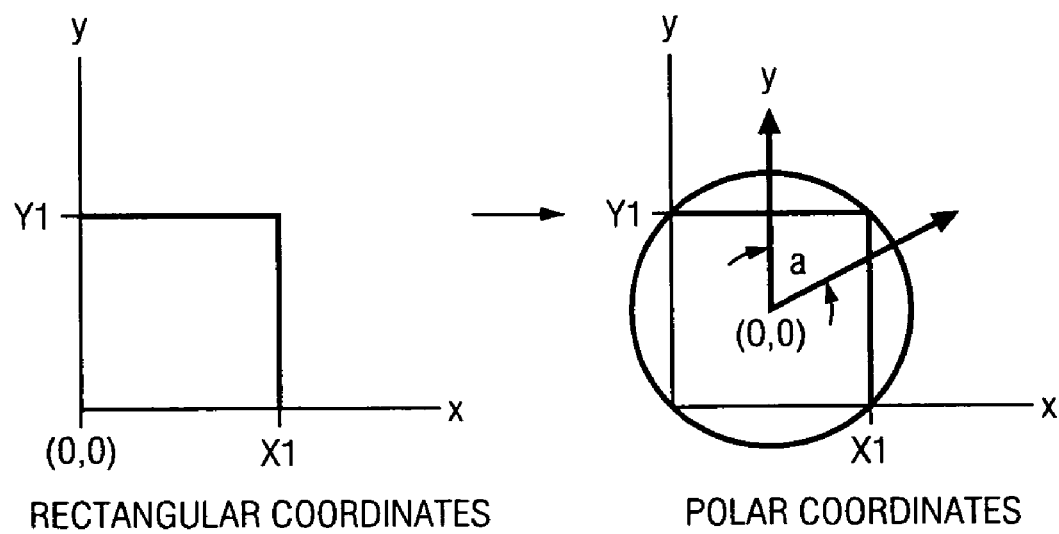
FIG. 2 is example of pseudo Matlab code that can be used in the cross correlation of two images.
FIG. 3 is illustration of the conversion between different coordinate systems.

While the making and using of various embodiments of the present invention are discussed in detail below, it should be appreciated that the present invention provides many applicable inventive concepts which can be embodied in a wide variety of specific contexts. The specific embodiments described herein are merely illustrative of specific ways to make and use the invention and do not delimit the scope of the invention.

In one embodiment of the instant invention is a system that is used in conjunction within an MRI machine that uses a predetermined pattern placed or projected onto a patient's head to track movement of a patient during an MRI scan. Optical systems record the position and movement of the pattern and are able to perform mathematical analysis of the pattern to determine the positional shift of the patient.

In this preferred embodiment, light is projected onto a target that reflects some of the light into an optical receiver. One of the innovations of the present inventions is the use of structured light. Structured light consists of an orderly pattern of rays of light that is suitable for cross-correlation. Examples of methods to create structured light include, but are not limited to, using of a laser to create a speckle pattern, a spatial filter using a projector to convey the structured light pattern (an example would be with use of a patterned slide), and using a light source directed towards an area with a known pattern. Other examples are an array of light emitters either positioned as a projector towards the target or as a light emitting tag placed on the target. Another example is a spatial light modulator used in the path of projected light such as a liquid crystal display or a MEMS device. Chemically patterned light emitting tags can also be used. Examples of these devices are a light emitting tag containing patterns created by phosphorescent paint, inks or dyes. Other examples include various fluorophores used in inks or dyes such as pthalacyamine and napthacyanine. In embodiments where inks and dyes are used with frequency shifting capabilities such as up converters and down converters, illuminating light should match the frequencies at which the tag produces light in detectable levels.

Since motion detection was implemented using a cross-correlation algorithm, any form of similarity within the structured light would adversely influence the robustness of the algorithm. Therefore, any regularity or order in the pattern would produce multiple peaks in the cross-correlation thus making it difficult to decide upon the highest one. This embodiment avoids the problem of similarity within the projected light source by the use of an optimized pattern of structured light.

Many algorithms and methods of signal processing can be employed by the present invention in order to determine and track movement of the structured light received either from the target or from the structured light generator. The preferred embodiment uses weighted averages, cross-correlation, Fourier-Mellin, phase correlation and image maximization to determine movement. Of course, other signal processing methods known in the art will suffice. A weighted average is one method used to calculate X and Y translational motions. The method treats every black pixel as a one and every light pixel as a zero. A pixel is considered black if its RGB value exceeds a certain preset value. In addition, a pixel is considered white if its RGB value is lower than a certain preset value. The algorithm calculates the center of the image's imaginary weight in much the same way as a center of mass would be calculated. The algorithm calculates the weighted average of the columns and rows. When the pattern translates in two-dimensional space, the weighted average stays at the same place within the pattern. This allows for the determination of the amount of translation that has occurred between the two images. One example of an implementation of this weighted average approach in a software application such as Matlab is given in FIG. 1.

Standard cross-correlation is another method that can be used to calculate the X and Y translation differences of the images. Cross-correlation compares two sequences of images of a single target on an element-by-element basis and is able to provide the point or peak of "most similarity". By calculating the coordinates of this peak, it is possible to find the translation between the two images. Cross-correlation of two images can be imagined as sliding one three dimensional image over another until a perfect fit it found. The cross-correlation of two complex functions f(t) and g(t) of a real variable t, denoted fHg is defined by the following equation where * denotes convolution and $\bar{f}$ is the complex conjugate of f(t):

$$f*g = \bar{f}(-t)*g(t),$$

One example of an implementation of this cross-correlation approach in a software application such as Matlab is given in FIG. 2.

In another embodiment, the cross-correlation of rotation is found by using a Fourier-Mellin algorithm. Fourier-Mellin method transforms Cartesian coordinates to polar coordinates and correlates the Fourier Transform of the two images to find the angle of rotation. One illustration of the difference in the coordinate systems is given by FIG. 3. The traditional definition of the Fourier-Mellin transform is:

$$f(t) = \frac{1}{2\pi i}\int_{c-i\infty}^{c+i\infty} F(s)e^{st}\,ds, t > 0,$$

The Fourier-Mellin transform is invariable in translation, rotation, and scale. The Fourier-Mellin method consists of four steps. First, the FFT (Fast Fourier Transform) of an image is taken. A FFT is a discrete Fourier transform algorithm which reduces the number of computations needed for N points from $(N^2)$ to $(2*N*(\lg N))$, where lg is the base-2 logarithm. If the function to be transformed is not harmonically related to the sampling frequency, the response of an FFT looks like a sinc function (although the integrated power is still correct). Aliasing (leakage) can be reduced by apodization using a tapering function. However, aliasing reduction is at the expense of broadening the spectral response.

The second step of the Fourier-Mellin transform is involves the step of taking the Cartesian coordinates and converting them to Log-Polar coordinates. This allows for a correlation between translation in the Fourier-Mellin domain and rotation in Cartesian domain.

Third, the Mellin Transform is taken. The Mellin transform is an integral transform that and is generally regarded as the multiplicative version of the two-sided Laplace transform. The general equation for a Mellin transform on an equation f(t) is:

$$\{Mf\}(s) = \varphi(s) = \int_0^\infty x^s f(x)\frac{dx}{x}.$$

Finally, the data from the output is analyzed to determine the point of most similarity and adjustments for movement may be made. One example of an implementation of this Fourier-Mellin approach in a software application such as Matlab is given in FIG. 4.

Another signal processing method used is Phase Correlation. Phase Correlation consists of taking the Fourier Transform of the two images and correlating the relative phases to find rotation or scale. Phase correlation is another technique that utilizes a Fast Fourier Transform or FFT.

By taking the two dimensional FFT of an image, phase information can be visualized. One equation used to acquire the FFT of an image is:

$$f_j = \sum_{k=0}^{n-1} e^{-2\pi i j \cdot (k/n)} x_k$$

In two dimensions, the $x_k$ can be viewed as an $n_1 \times n_2$ matrix. The algorithm corresponds to first performing the FFT of all the rows and then of all the columns (or vice versa).

In the phase correlation technique, it is possible to compare the phases of the two images to detect the difference between the two images. By determining the point where the phases are at the maximum congruency, it is possible to determine the angle of rotation between two images. By analysis of the transform, the phase information that is contained in an image is acquired. The change in the phase information holds the key to determining the rotation angle of the image. The peak in the middle of the graph corresponds to the point of most congruency of the phases of the two images, and gives the change in angle that the image has undergone. The phase correlation algorithm was utilized using the following steps. First, the discrete FFT of two images is calculated. Second, the conjugate of the second image is taken. Third, the Fourier transforms are multiplied together element-wise. Fourth, the product of this multiplication is normalized element-wise. Fifth, the normalized cross power spectrum inverse transform is performed. Sixth, the peak of the inverse transform is taken. This step may include using sub-pixel methods to determine where a peak is found.

In one preferred embodiment, the results from the structured light were optimized by maximizing the percentage of the image taken up by structured light without the structured light exceeding the boundaries of the target image. This preferred upper boundary (i.e. the structured light staying within the target image) is a result of the reliance by the cross-correlation algorithms on a pixel-by-pixel comparison of two images. Since the algorithm compares structured light, it is desirable to achieve the best ratio of pixels per structured light element. If the structured light takes up 100% of the image, no change can be perceived between the structured light and the surrounding environment. If the size of the structured light is too big (90%), different translational and rotational motions might take some of the structured light out of the field of view of the camera thus contributing to loss of information contained in the structured light. On the other hand, if the structured light constitutes too little (1%) of the overall image, cross-correlation and Fourier-Mellin algorithms will not be robust enough to perform precise calculations.

Figure 5:
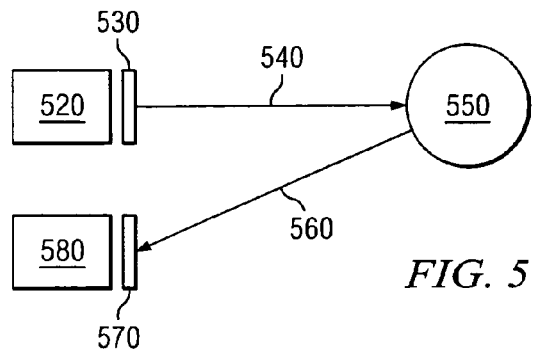
FIG. 5 is a schematic illustration of a head tracking apparatus comprising a light source, structured light generated between the light source and the conveying light path, an object to be imaged, and a detector array.

In FIG. 5, one preferred embodiment is shown. Light is generated with coherent laser 520. The light passes through structured light generator 530 that is located between light source 520 and conveying light path 540. Structured light generator 530 could be implemented as, but not limited to, a speckle pattern, a spatial filter, a slide, an array of light emitters, or a spatial light modulator based, for example, on a liquid crystal or a MEMS device. The structured light travels through conveying path 540 to object to be imaged 550. Conveying path 540 could be an image preserving optical fiber, free space, or any medium which does not disrupt the transmission of the structured light. The structured light appears on object to be imaged 550. Next the structured light is reflected onto return light path 560 which could be an image preserving optical fiber, free space, or any medium which does not disrupt the transmission of the structured light. If return light path 560 is free space, image optics have to be correctly determined using lenses, mirrors or other optical train as would be well known in the art. The light arrives at analyzer 570, which could be a filter or polarizer before entering detector array 580. In this embodiment, detector array 580 is implemented as a CCD camera. One exemplary part that could be used is a Digital Rebel XT made by Canon. The structured light pattern is used to detect the movement of object 550.

Figure 6:
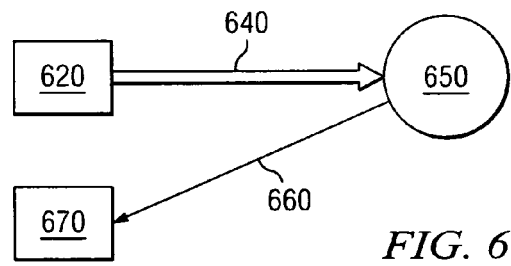
FIG. 6 is a schematic illustration of a head tracking apparatus comprising a light source, structured light generated in the conveying light path, an object to be imaged, and a detector array.

FIG. 6 shows another preferred embodiment. Light is generated with coherent laser 620. It enters conveying light path 640. Conveying light path 640 could be a multimode fiber or any medium that does not disrupt the transmission of the structured light. Inside conveying light path 640, a structured light pattern is generated, for example a speckle pattern. The structured light appears on object to be imaged 650. Next the structured light goes into return light path 660, which could be an image preserving fiber, example-coherent bundle, free space, or through any medium which does not disrupt the transmission of the structured light. If return light path 660 is free space, image optics have to be correctly determined using lenses, mirrors or other optical train as would be well known in the art. The structured light enters detector array 670 which, in this embodiment, is implemented as a CCD camera. The structured light pattern is used to detect the movement of the object 650.

Figure 7:
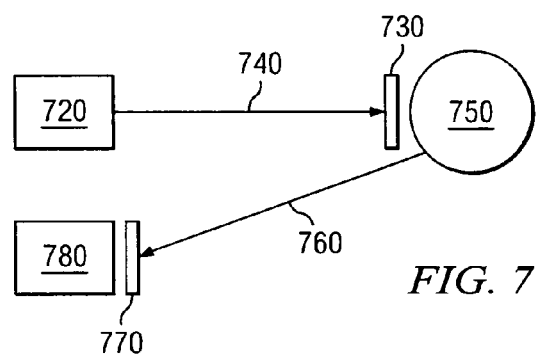
FIG. 7 is a schematic illustration of a head tracking apparatus comprising a light source, structured light that is generated between the conveying light path and the object to be tracked, the object to be imaged, and a detector array.

In FIG. 7, another preferred embodiment is shown. Light is generated with coherent laser 720. The light travels on conveying path 740 to structured light generator 730 that is located between conveying light path 740 and object to be imaged 750. Conveying light path 740 could be an optical fiber, free space, or any medium that does not disrupt the transmission of the structured light. Structured light generator 730 could be implemented as, but not limited to, a speckle pattern, a spatial filter, a slide, an array of light emitters, or a spatial light modulator based, for example, on a liquid crystal or a MEMS device. The structured light appears on object to be imaged 750. Next the structured light goes into return light path 760 which could be an image preserving fiber, example-coherent bundle, free space, or any medium that does not disrupt the transmission of the structured light. If return light path 760 is free space, image optics have to be correctly determined using lenses, mirrors or other optical train as would be well known in the art. The light arrives at analyzer 770, which could be a filter or polarizer before entering detector array 780. Detector array 780 is implemented in this embodiment as a CCD camera. The structured light pattern is used to detect the movement of object 750.

Figure 8:
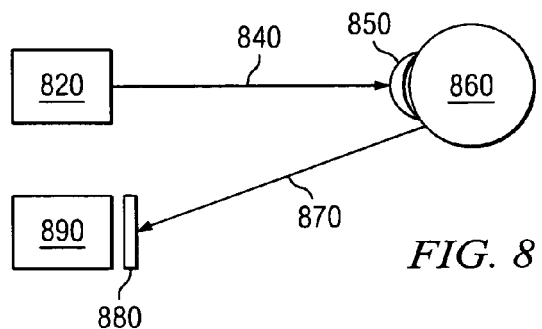
FIG. 8 is a schematic illustration of a head tracking apparatus comprising a light source, a structured light generator at the object to be imaged, the object to be imaged, and a detector array.
Figure 9:
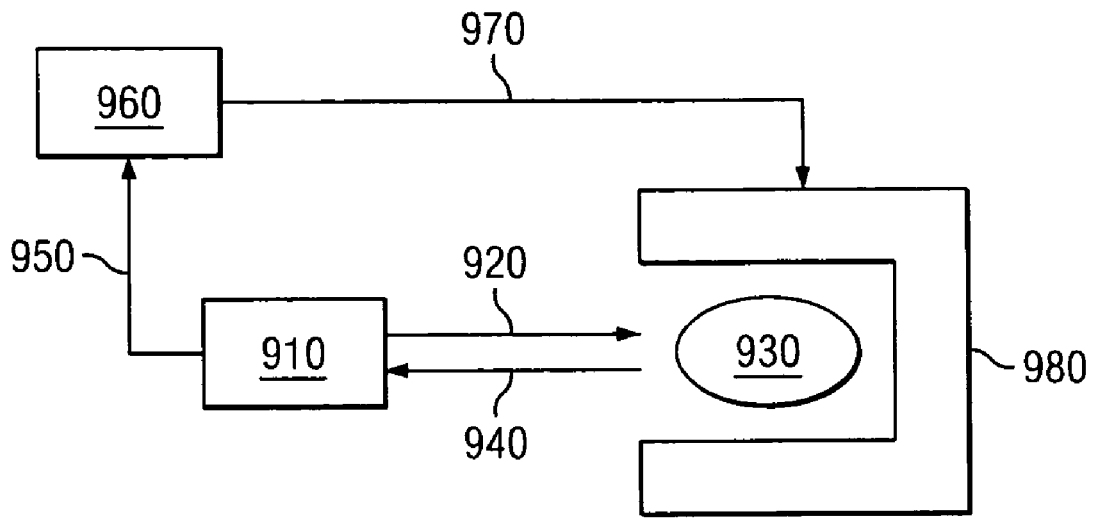
FIG. 9 is a block diagram of a head tracking apparatus used to provide active feedback to the measurement fields of the MRI.

In FIG. 8, another preferred embodiment is shown. Light is generated with coherent laser 820. The light travels on conveying path 840 to structured light generator 850 that is located on the object. Structured light generator 850 is a reflective material that produces structured light; an example would be a tag with a high-resolution matrix on it, or a hologram. The structured light appears on object to be imaged 860. Next the structured light goes into return light path 870. If return light path 870 is free space, image optics have to be correctly determined using lenses, mirrors or other optical train as would be well known in the art. The light arrives at analyzer 880, which could be a filter or polarizer before entering detector array 890. The filter can be responsible for selectively allowing a specified frequency of light to reach the detector. In this embodiment, detector array 890 is implemented as a CCD camera. The structured light pattern is used to detect the movement of object 860.

In yet another preferred embodiment, structured light generator 850 is a physical target with the ability to independently produce a structured light pattern. In this embodiment, a matrix of high intensity LED devices is arranged in the pattern to transmit a structured light beam to a receiver.

In another embodiment, structured light generator 850 is a tag which has impressed on it a laser luminophore such as a polycyclic chemical compound that is usually characterized as fluorescent. Fluorophores are also suitable. Suitable laser luminophores are available as laser pumped dyes sold for example by Lambda Physik Goettingen, Germany. Typical laser luminophores display fluorescence in the range of 300 to 2500 nm and have a peak width of about 200 nm. Suitable dyes are applied to a reflective tag in a pattern which produces structured light when illuminated with radiation and wavelengths which produced fluorescence. Light sources such as laser light sources emitting in the 200 to 600 nm range are suitable. The most preferred sources include XeCl-excimer lasers (309 nm), nitrogen lasers (337 nm) and Nd:YAG (335 nm). Other preferred light sources LEDs which generally emit light in a wavelength range of about 400 to 600 nm. Chemical compounds useful as fluorophores in this embodiment include polycyclic hydrocarbons including catacondensed and pericondensed aromatics, heterocyclic hydrocarbons, including condensed and substituted indoles, oxazoles, oxadiazoles and furnin compounds and xanthono and xanthonone derivatives including condensed systems, acids and salts. Representative laser luminophores which are useful in this embodiment include p-quatraphenyl, perchlorate benzoic acid, monohydrochloride. Of course, other laser luminophores and fluorophores will also suffice. Representative laser luminophores which are useful in this embodiment include p-quatraphenyl, perchlorate benzoic acid, monohydrochloride. Of course, other laser luminophores will also suffice.

In yet another embodiment, visible dyes and invisible dyes such as laser luminophores or flurophores are used on a tag in different or similar patterns. Illuminating radiation of different frequencies can then be used to produce reflectances in structured light of different frequencies so that changes in motion of the structured light generator can be detected in two frequencies at the same time. The redundancies are available allow more accurate determination of movement of the structured light generator.

Figure 18:
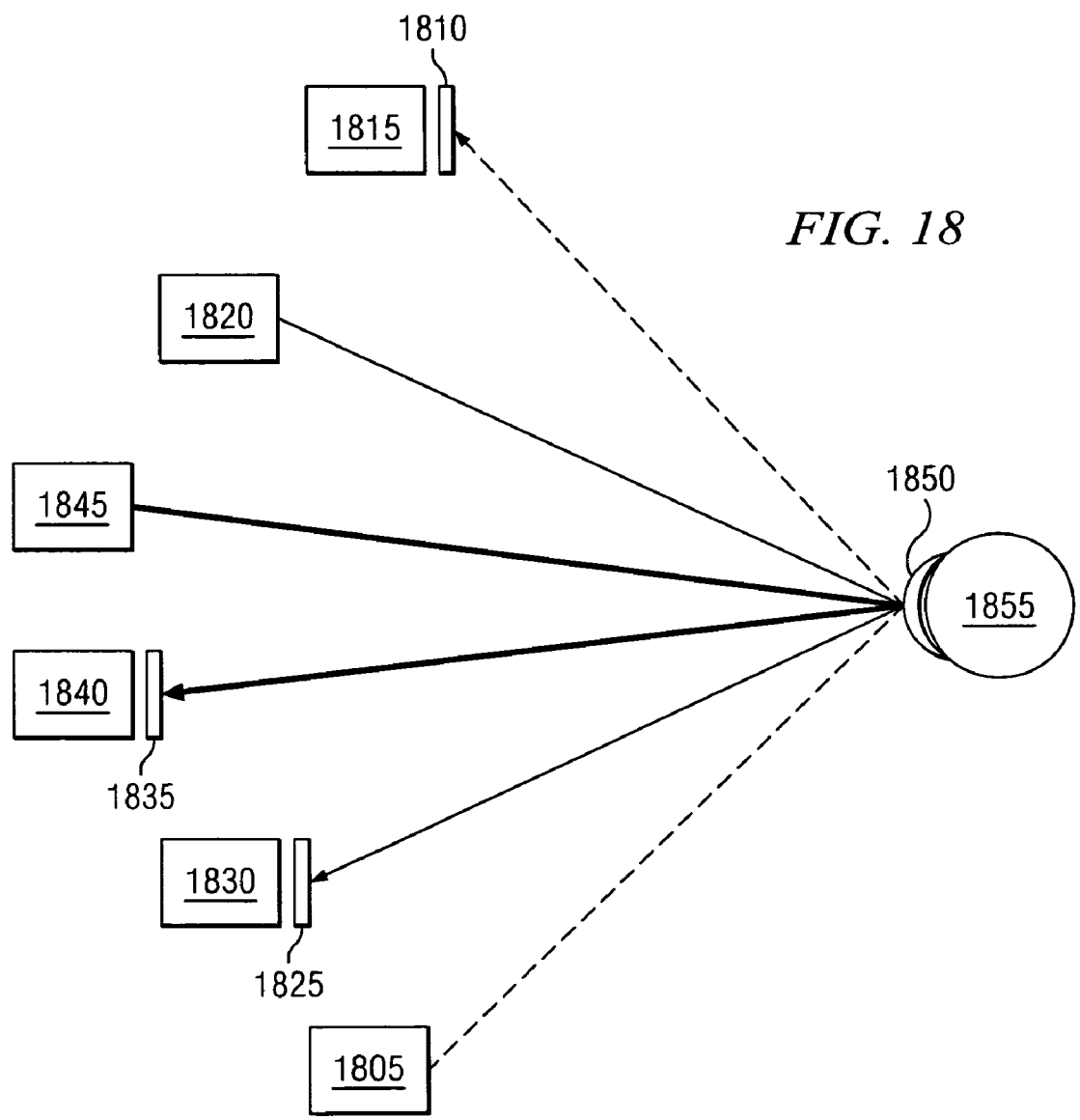
FIG. 18 is an illustration of a target comprised of three patterns made up of different dyes irradiated by sources of different frequencies.

In FIG. 18, another preferred embodiment is shown. Structured light generator 1850 in this embodiment is a physical tag having three different patterns impressed on it with dyes including a visible dye, a laser luminophore dye, and a flurophore. Each of the patterns is different. Light is generated corresponding to the first dye by light source 1805. Reflected light from light source 1805 impinges on structured light generator 1850 and is reflected toward filter 1810 and receiver 1815. Filter 1810 is designed to tune the light received from structured light generator 1850 to a frequency receptive to the laser luminophore dye. Light source 1820 produces light at a certain different frequency which impinges on structured light generator 1850 and is reflected toward filter 1825 and receiver 1830. Filter 1825 is designed to tune the light from light source 1820 to the frequency of the flurophore included in structured light generator 1850.

Light source 1830 generates light at a third frequency which impinges on structured light generator 1850 and is reflected at a certain visible frequency toward filter 1835 and receiver 1840. Filter 1835 is designed to tune the reflected light from tag 1850 to a visible frequency. Each of the receivers is capable of registering the pattern produced by a specific dye on structured light generator 1850.

In a block diagram of head tracking apparatus 910 providing active real time feedback to the measurement fields of MRI instrument 980 is shown. Light is generated with head tracking apparatus 910. The structured light travels on conveying path 920 to object 930 under analysis. Next the structured light goes into return light path 940 which could be an image preserving fiber, example-coherent bundle, or free space. The structured light is registered at head tracking apparatus 910 and sent to interface 960 between MRI instrument 980 and the head tracking apparatus via information-carrying channel 950. Interface 960 can be implemented as a computer. Interface 960 calculates the change in position of object 930 under analysis and sends the information to MRI instrument 980 via information carrying channel 970. MRI instrument 980 adjusts the fields according to the new position information. This is accomplished in real time between successive scans of the MRI instrument.

Figure 10:
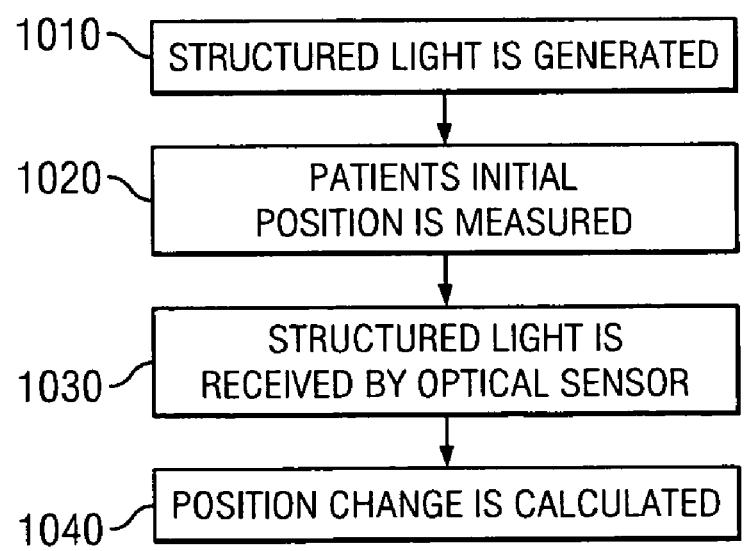
FIG. 10 is a flow chart illustrating a method of head tracking.

In FIG. 10, a flow chart illustrating the method of head tracking is shown. In the first phase structured light is generated 1010. In the second phase, structured light is used to measure position 1020 of the object. In the third phase, the object moves and the received structured light 1030 pattern changes. In the fourth phase, the change in the received structured light pattern is calculated 1040.

Figure 11:
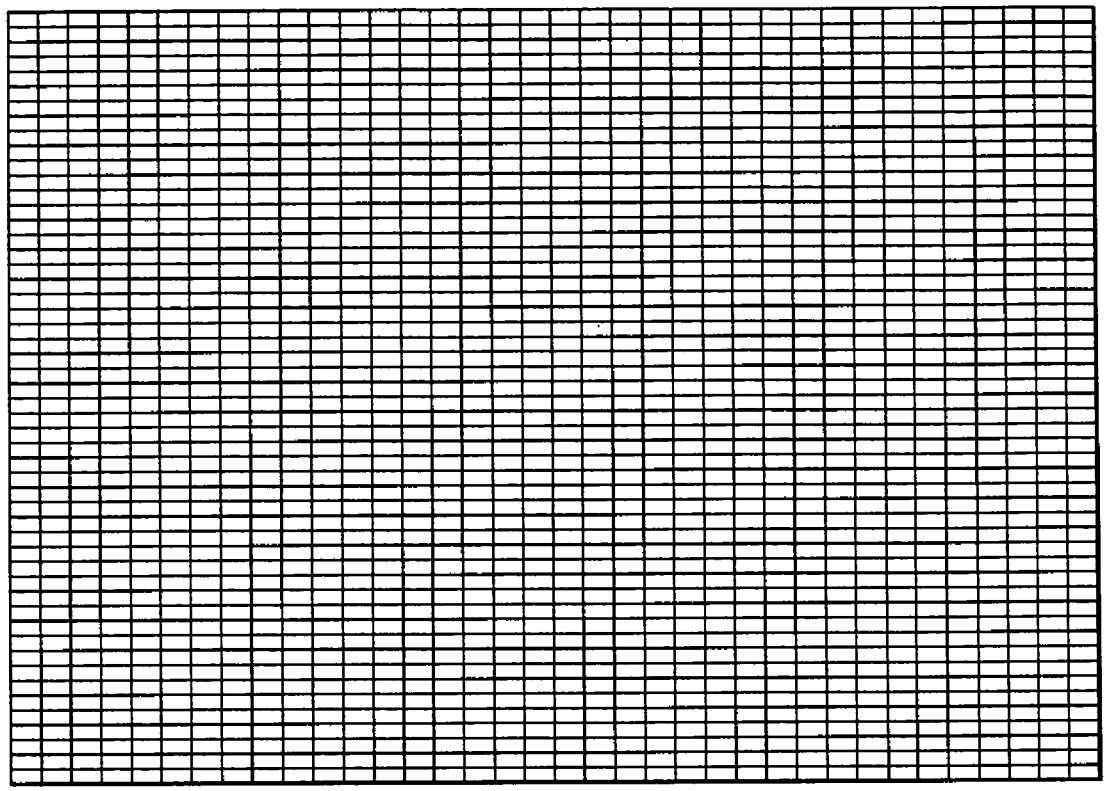
FIG. 11 is an illustration of one predetermined target that can be used to with structured light.
Figure 12:
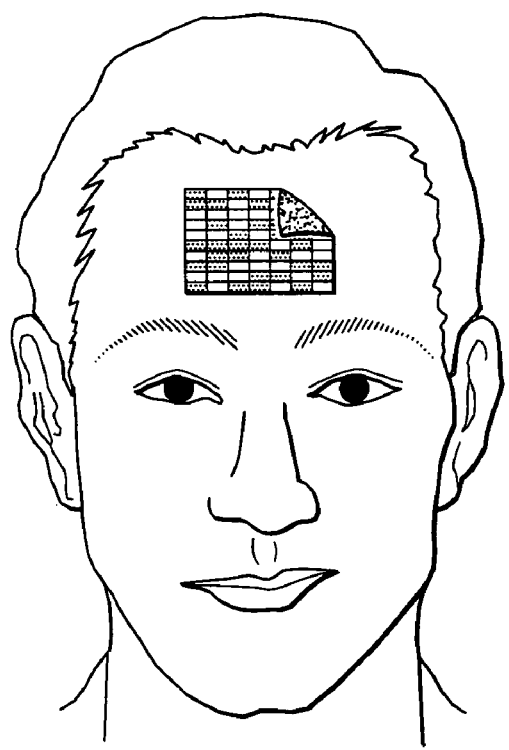
FIG. 12 is an illustration of a predetermined target being placed onto a patient's forehead.
Figure 13:
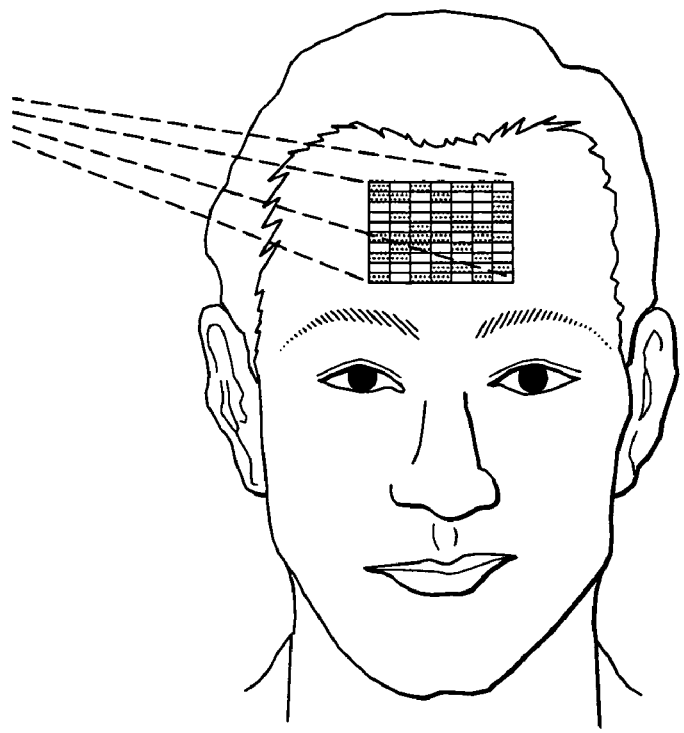
FIG. 13 is an illustration of a predetermined target being projected onto a patient's forehead.

The object for the structured light to be focused on may be created in a number of ways depending on the embodiment chosen. One preferred embodiment is the use of a random monochromatic pattern that is used as a target. FIG. 11 is an example of one target that may be used to optimize the results from structured light. FIG. 12 is an illustration of the technique of placing this type of target pattern or tag onto a patient's forehead. FIG. 13 is an illustration of the technique of projecting this type of pattern onto a patient's forehead. One an exemplary part that can be used for projection is an EP 751DLP made by Optima.

Figure 14:
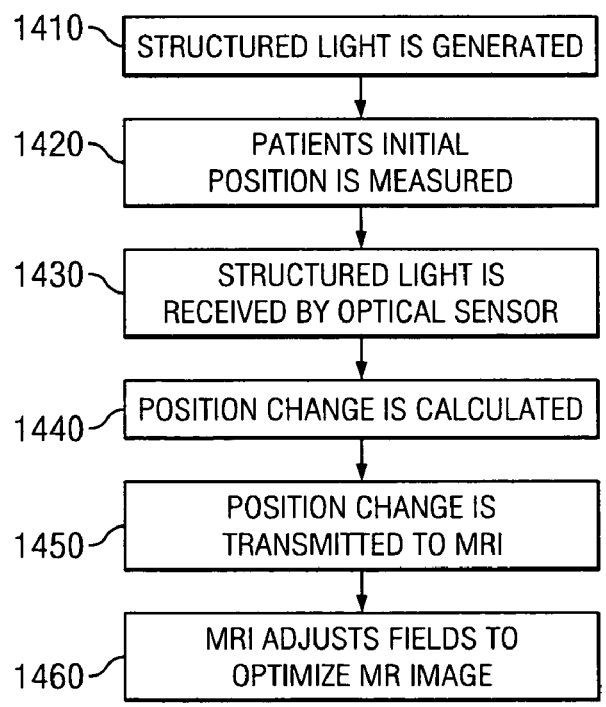
FIG. 14 is a flow chart illustrating a method of providing active feedback to the measurement fields of the MRI based on head tracking data.

In FIG. 14, a flow chart illustrating the method of providing active feedback to the measurement fields of the MRI based on the head tracking data is shown. In the first phase structured light is generated 1410. In the second phase, structured light is used to measure position 1420 of the object. In the third phase, the object moves and the received structured light 1430 pattern changes. In the fourth phase, the change in the received structured light pattern is calculated 1440. In the fifth phase, the calculated change in the position of the object is sent to MRI instrument interface 1450. In the sixth phase, interface 1450 communicates with the MRI instrument to adjust the fields of the MRI to improve scan 1460. This is accomplished in real time between successive scans of the MRI instrument.

FIG. 15 is a flow chart illustrating one implementation of the Translation Detection Algorithm. Structured light is projected on target 1505. A first image is recorded (image N) 1510. Another image is then recorded (image N+1) 1515. Host computer cross-correlates images (images N and N+1) 1520. The host computer finds the peak of cross-correlation that corresponds to the point of 'most similarity' 1525. The host computer infers transformation data from the location of the cross-correlation peak and sends results to the MRI 1530. The next image is recorded (image N+2) 1535. Host computer cross-correlates images N+2 and N+1 1540. Find the peak of cross-correlation that corresponds to the point of 'most similarity' 1545. Infer transformation data from the location of the cross-correlation peak and send results to MRI 1550.

FIG. 16 is a flowchart illustrating a possible method of calibration. Structured light is projected on target 1605. The first step is for a first image is recorded 1610. The next step is for a second image is recorded (image N+1) 1615. The host computer cross-correlates acquired images 1620. The coordinates from image N are assigned to be at a point based in Cartesian coordinate system 1625. This point can be used as a reference point for all further image calculation.

Figure 17:
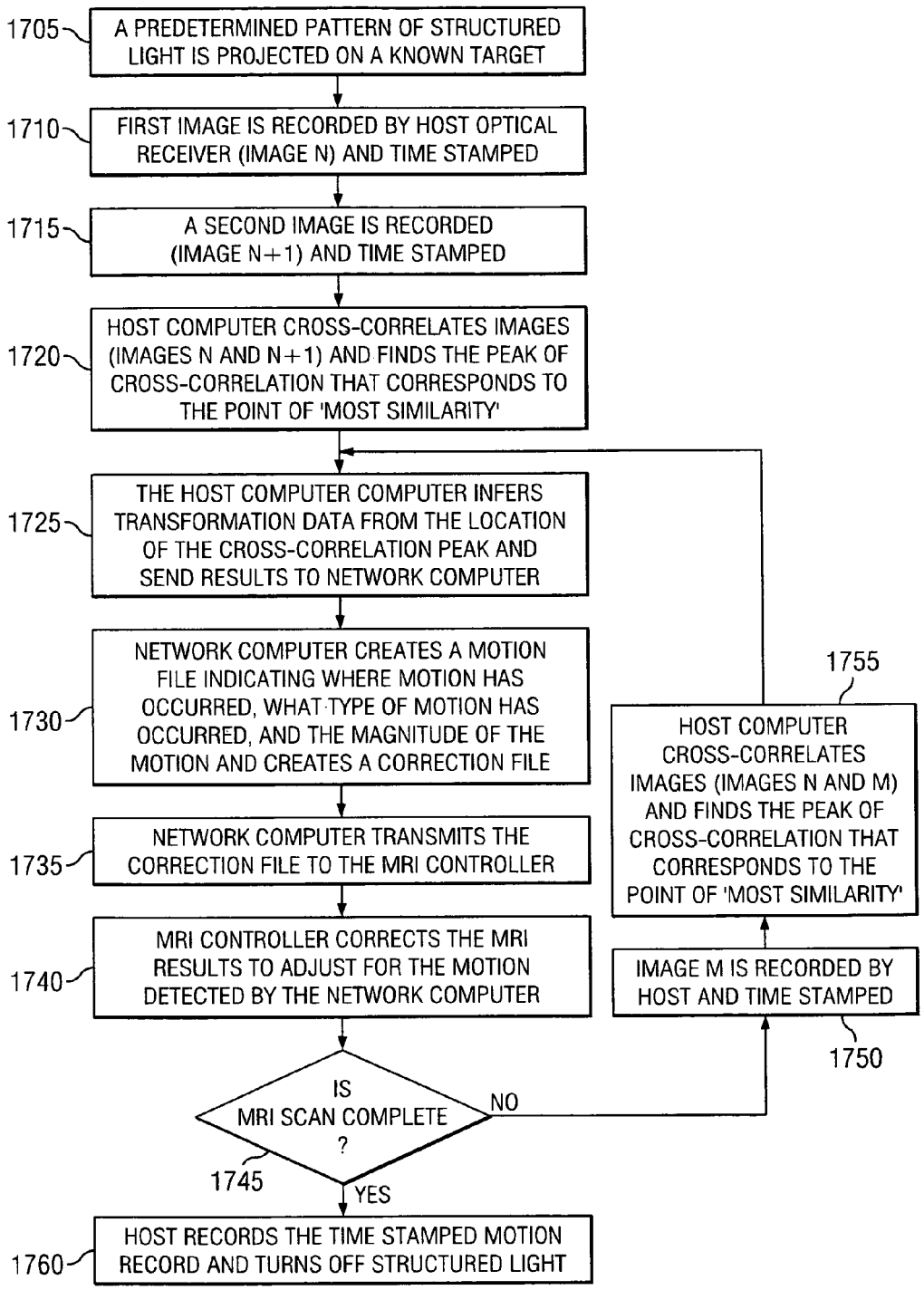
FIG. 17 is a flow chart illustrating one preferred embodiment of image correlation.

FIG. 17 is a flowchart illustrating another method of using structured light to correct for motion data. In this embodiment, there are three separate components: a host connected to an optical receiver capable of receiving, processing, and cross-correlating images, a network computer to create a motion file based on information obtained from the host computer, and an MRI controller capable of interfacing with the network computer to accept data from the network computer and correct MRI results based upon data obtained by the network controller.

In the embodiment that is illustrated by FIG. 17, the first step is to project a predetermined pattern of structured light onto target, where the area of the structured light is less than the area of the pattern, and where the structured light falls completely within the target 1705. Structured light is reflected off the target and into the host optical receiver, and an image (image N) is captured by host optical receiver and time stamped 1710. The next step is for a second image to be recorded (image N+1) and time stamped 1715. The host computer cross-correlates images (images N and N+1) and finds the peak of cross-correlation that corresponds to the point of 'most similarity' 1720. The host computer infers transformation data from the location of the cross-correlation peak and sends results to network computer 1725. The network computer creates a motion file indicating where motion has occurred, what type of motion has occurred, and the magnitude of the motion and creates correction file 1730. The network computer transmits the correction file to MRI controller 1735. The MRI controller corrects the MRI results to adjust for the motion detected by the host computer by using the time stamps on each image taken by the MRI to the motion data time stamped by host computer 1740. If the MRI scan is complete, the host turns off structured light 1760. If the MRI scan is not complete, image M is recorded by host and time stamped 1750. The host computer cross-correlates images (images N and M) and finds the peak of cross-correlation that corresponds to the point of 'most similarity' 1755. The host computer infers transformation data from the location of the cross-correlation peak from the original image N and the new image M and sends results to network computer 1725.

It is envisioned that the embodiment illustrated by FIG. 17 could be modified to allow for the three components (e.g. network computer, host computer, and MRI controller) to be integrated into one or more components. It is further envisioned that one computer to accomplish one or more of the tasks, i.e. a central computer both capture and process images and transmit the data directly to an MRI. It is further envisioned by the inventors that the comparison in images could be made from the each previous image in the sequence rather than from the first image to give a clearer view of subtle changes in movement.

It is further envisioned that there are other methods to use structured light patterns; i.e. electronic detection patterns such as sensors attached to the patient's head that could be used as an alternative to optical receivers. Moreover, any number of different types of light source may be used to project light, including, but not limited to, strobe lights. It is further envisioned that in some embodiments target itself emanate light by the use of a target that emits light directly into an optical receiver.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

As will be recognized by those skilled in the art, the innovative concepts described in the present application can be modified and varied over a tremendous range of applications, and accordingly the scope of patented subject matter is not limited by any of the specific exemplary teachings given.

The invention claimed is:

1. A motion tracking method for determining the location and orientation of at least one object being imaged by a medical imaging device and moving in space relative to a motion tracking device, comprising the steps of:
    affixing a target on the object;
    projecting a structured light pattern onto the target;
    receiving return light from the target through an optical receiver on the motion tracking device;
    converting the return light into a first digital image and a second digital image; and
    comparing the first digital image and the second digital image to obtain object motion information.

2. The method of claim 1, further comprising the step of adjusting an MRI scan to compensate for the object motion information.

3. The method of claim 1, further comprising the step of placing the target inside an MRI apparatus.

4. The method of claim 1, further comprising the step of coordinating the target with a patient surface.

5. The method of claim 3, further comprising the step of originating the structured light pattern within the MRI apparatus.

6. The method of claim 1, further comprising the step of generating the structured light pattern from a source selected from a group consisting of: a low-intensity pulsed light source, or continuous light source.

7. The method of claim 1 further comprising the step of sensitizing the optical receiver to at least one non-visible frequency.

8. The method of claim 2, further comprising the step of transmitting the object motion information to a computer for alignment of the medical imaging device.

9. The method of claim 2, further comprising the step of guiding an interventional procedure with the object motion information.

10. The method of claim 2, further comprising the step of evaluating changes in brain images with the object motion information acquired over time periods selected from the group consisting of minutes, hours, days, weeks, and months, or a combination thereof.

11. A method for detecting position changes of a moving patient during a medical imaging operation, comprising the steps of:
    locating a target on the moving patent;
    generating a structured light coupled to the target;
    receiving the structured light through an optical receiver;
    converting the structured light into coordinate data;
    measuring an initial position of the moving patient with the structured light;
    measuring a second position of the moving patient with the structured light;
    determining a position shift between the initial position and second position; and
    transmitting the position shift to a medical imaging device.

12. The method of claim 11, further comprising the step of adjusting the medical device to correct for the position shift.

13. The method of claim 11, wherein the step of transmitting further comprises:
    transmitting the position shift to an MRI device.

14. The method of claim 11, wherein the step of generating structured light further comprises the steps of:
    providing a structured light projector; and,
    focusing the structured light projector on a patient.

15. The method of claim 11, wherein the step of generating structured light further comprises:
    attaching a reflective pattern to a patient; and
    irradiating the pattern with a coherent light source.

16. The method of claim 11, wherein the step of receiving includes the step of pulling a CCD camera.

17. The method of claim 15, wherein the step of receiving includes receiving at least two frequencies of light.

18. The method of claim 11, wherein the step of generating includes the step of using a laser focused through a filter that acts as a structured light generator.

19. A method of analyzing movement of an object being imaged by a medical imaging device and moving in space relative to a motion tracking device, comprising the steps of:
    affixing a light source to the object;
    generating a structured light from the light source;
    receiving structured light from the object into an optical receiver on the motion tracking device;
    converting the structured light into a first digital image and a second digital image; and
    comparing the first digital image and the second digital image to determine movement of the object.

* * * * *

UNITED STATES PATENT AND TRADEMARK OFFICE
CERTIFICATE OF CORRECTION

PATENT NO. : 7,911,207 B2
APPLICATION NO. : 12/152917
DATED : March 22, 2011
INVENTOR(S) : Duncan L. MacFarlane et al.

It is certified that error appears in the above-identified patent and that said Letters Patent is hereby corrected as shown below:

On the title page

Item (73) Assignee should read:

Board of Regents, The University of Texas System, Austin, TX (US)

United States Government, Department of Veterans Affairs, Washington, DC (US)

Signed and Sealed this
Eighteenth Day of February, 2014

Michelle K. Lee
*Deputy Director of the United States Patent and Trademark Office*